United States Patent
Esposito et al.

(10) Patent No.: US 7,509,562 B1
(45) Date of Patent: Mar. 24, 2009

(54) MAINTAINING DATA INTEGRITY FOR EXTENDED DROP OUTS ACROSS HIGH-SPEED SERIAL LINKS

(75) Inventors: Benjamin Esposito, Oviedo, FL (US); Christopher Cook, Cary, NC (US)

(73) Assignee: Altera Corporation, San Jose, CA (US)

( * ) Notice: Subject to any disclaimer, the term of this patent is extended or adjusted under 35 U.S.C. 154(b) by 495 days.

(21) Appl. No.: 10/821,377

(22) Filed: Apr. 9, 2004

(51) Int. Cl.
   *H03M 13/15* (2006.01)
(52) U.S. Cl. ........................... 714/775; 714/776
(58) Field of Classification Search ................ 714/758, 714/776, 775
   See application file for complete search history.

(56) References Cited

U.S. PATENT DOCUMENTS

| | | | | |
|---|---|---|---|---|
| 5,414,707 A | * | 5/1995 | Johnston et al. | 370/395.6 |
| 5,642,347 A | * | 6/1997 | Buckland | 370/242 |
| 5,784,370 A | * | 7/1998 | Rich | 370/395.1 |
| 5,844,918 A | * | 12/1998 | Kato | 714/751 |
| 6,084,888 A | * | 7/2000 | Watanabe et al. | 370/473 |
| 6,173,431 B1 | * | 1/2001 | Rittle | 714/778 |
| 6,438,723 B1 | * | 8/2002 | Kalliojarvi | 714/751 |
| 6,650,140 B2 | | 11/2003 | Lee et al. | |
| 6,724,328 B1 | | 4/2004 | Lui et al. | |
| 6,750,675 B2 | | 6/2004 | Venkata et al. | |
| 6,963,570 B1 | * | 11/2005 | Agarwal | 370/395.32 |
| 2001/0033188 A1 | | 10/2001 | Aung et al. | |
| 2004/0140837 A1 | | 7/2004 | Venkata et al. | |

OTHER PUBLICATIONS

Eilers, D., et al., "A Prototype of an AAL for High Bit Rate Real-Time Data Transmission Systems over ATM Networks Using a RSE CODEC", Proc. RSP 2000, Jun. 2000, pp. 109-114.*

* cited by examiner

*Primary Examiner*—Stephen M Baker
(74) *Attorney, Agent, or Firm*—Ropes & Gray LLP

(57) ABSTRACT

Improved error correction techniques and circuitry are provided. The error correction circuitry may be integrated with a programmable logic device (PLD), or it may be wholly or partly on a separate integrated circuit. The circuitry may be capable of providing data recovery during extended drop out periods of a high speed serial link with an embedded clock signal.

32 Claims, 8 Drawing Sheets

MAINTAINING DATA INTEGRITY FOR EXTENDED DROP OUTS ACROSS HIGH-SPEED SERIAL LINKS

BACKGROUND OF THE INVENTION

This invention relates to error correction circuitry and more particularly to error correction circuitry that can provide data recovery during extended drop out periods of a high speed serial link with an embedded clock signal.

Typical error correction techniques, such as, for example, forward error correction (FEC), allow a receiving device to detect and correct corrupted data that contains fewer than a predetermined number of errors. FEC techniques add extra bits or bytes to each transmitted data character or code block using a predetermined algorithm.

An increasingly important type of signaling between devices is serial signaling in which the clock signal information is embedded in or can be derived from the serial data stream so that no separate clock signal needs to be transmitted. For example, data may be transmitted serially in packets of several successive serial data words preceded by a serial header that includes several training bits having a predetermined pattern of binary ones and zeros. The clock signal information is embedded in the data signal by the high-to-low and/or low-to-high transitions in that signal, which must have at least one high-to-low or low-to-high transition within a certain number of clock signal cycles. At the receiver, the clock signal is recovered from the data signal for use in properly processing the data signal. For convenience herein, this general type of signaling will be referred to generically as "clock data recovery" or "CDR" signaling.

CDR signaling is now being used in many different signaling protocols. These protocols vary with respect to such parameters as clock signal frequency, header configuration, packet size, data word length, number of parallel channels, etc. CDR signaling is well known as shown, for example, in Aung et al. U.S. Patent Publication No. 2001/0033188, published Oct. 25, 2001 and Aung et al. U.S. Patent Publication No. 2003/0212930, published Nov. 13, 2003.

Ordinarily, FEC transmission techniques are able to provide data correction for extended data errors across data links. However, when a reference clock signal is embedded within a serial data stream, extended data errors may also result in a loss of the reference clock signal and a loss of synchronization between the transmitter and the receiver. This loss of synchronization limits the effectiveness of typical FEC techniques.

Programmable logic devices ("PLDs") are well known as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

It would be highly desirable to have the ability to use PLDs to avoid having to always design and build error correcting transmitters and receivers that are specific to each of the many different error correction techniques, protocols, and specifications.

SUMMARY OF THE INVENTION

In accordance with this invention, improved error correction techniques and circuitry are provided. The circuitry of this invention is preferably programmable in at least some respects and may either be included in the I/O circuitry of an integrated circuit with other more traditional PLD circuitry, or with other non-programmable circuitry. It may also be at least partly included on a separate integrated circuit. If the data correction circuitry is at least partly on a separate circuit, it may be configured to facilitate efficient coupling to other circuitry (e.g., in a common package).

Error correction techniques and circuitry in accordance with the invention preferably use traditional FEC data frames and break the FEC frames into sub-packets. Before each sub-packet is transmitted, an IDLE/SYNC packet is sent. Thus each received FEC frame will contain multiple data sub-packets, each proceeded by an IDLE/SYNC packet.

Normally, after an extended loss of the transmitted data (e.g., a data drop off), the data receiver loses synchronization with the data transmitter. Thus, after data loss, the position of the incoming valid data would be unknown relative to the last valid data received prior to the data loss. With gaps or holes in the data of undeterminable size, FEC techniques would be unable to recover the lost data. However, according to the present invention, the IDLE/SYNC packets may be used by the data receiver to determine the relative position of the received data and allow the traditional error correction techniques to function properly. After the data receiver detects a data drop off or another type of error in the transmitted data, the receiver will ignore the remaining incoming data until it receives an IDLE/SYNC packet. The information contained in the IDLE/SYNC packet allows the data receiver to determine the relative position of the following data sub-packet. The FEC system may then be able to correct the errors in the FEC data frame.

Various characteristics of this data (e.g., frame size, packet size, word length, etc.) are preferably selectable (e.g., programmable). In addition, the error correcting receiver and/or transmitter circuitry of this invention may also be programmable in other respects. For example, the error correcting circuitry may implement various error correcting algorithms with programmable operating parameters which may be adjusted or optimized based on the nature of the data transmitted, the transmission link, or other system parameters. The error correcting circuitry may also include the capability of operating selectable numbers of error correcting data receiver and/or transmitter subcircuits in parallel.

The circuitry of this invention may also be programmable to alternatively support other types of non-CDR signaling such as non-CDR low-voltage differential signaling ("LVDS"). The circuitry of this invention may be constructed to provide signals such as loss-of-lock and run-length violation signals that can be used as indications that various parts of the circuitry need to be reset. Circuitry for facilitating reset and/or power down of various portions of the circuitry can also be provided. Circuitry for selectively creating various types of test loops in the circuitry may be provided to facilitate testing various portions of the circuitry. Circuitry for programmably modifying a reference clock signal in certain modes of operation (especially a reference clock signal output by the programmable logic device) may also be provided.

Because the invention facilitates handling data with a PLD, the logic of the PLD can be used to manipulate the data in accordance with whatever protocol is being used (e.g., with respect to such aspects as byte alignment, comma detect, word length, or any other aspect of decoding the data on the receiver side and/or encoding the data on the transmitter side). The present combination of error correction techniques and PLD circuitry is therefore very advantageous.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
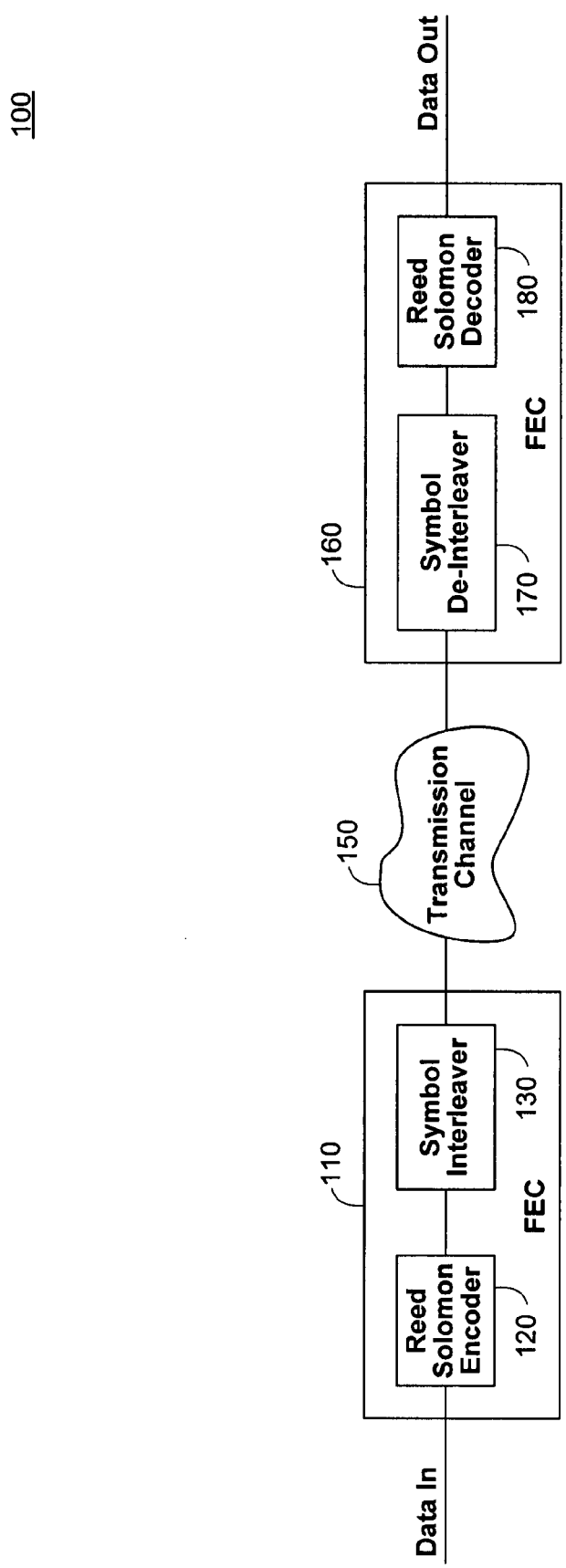
FIG. 1 is a simplified block diagram of an illustrative embodiment of a typical forward error correction (FEC) system.

FIG. 1 shows an illustrative diagram of existing forward error correction (FEC) system 100. FEC system 100 may allow data corrupted during transmission to be corrected without requiring retransmission of the data. In FEC system 100, data is encoded by FEC encoder 110 and then transmitted over transmission channel 150 to FEC decoder 160 which decodes and outputs the received data.

Exemplary FEC encoder 110 may contain Reed-Solomon encoder 120 and symbol interleaver 130. Reed-Solomon code is a data correction algorithm commonly used in FEC techniques. A Reed-Solomon encoder converts a stream of digital data into a number of information codewords adding additional "redundant" bits. A Reed-Solomon decoder may then attempt to correct errors in the received data in order to recover the original data stream. The number and type of errors that can be corrected depends on the characteristics and parameters of the Reed-Solomon code, such as the size of the codewords and the number of additional bits. The Reed-Solomon algorithm and the circuitry used to implement Reed-Solomon encoders and decoders are well known and are commonly used to provide error detection and correction.

The output of Reed-Solomon encoder 120 may then be input to symbol interleaver 130. Symbol interleavers and de-interleavers are also well known and may be used to mitigate the effects of multiple, successive data errors in a data stream. These types of data errors can be caused by occurrences such as an extended data drop-off or sudden periods of error inducing noise (e.g., burst noise). An interleaver takes a data stream and modifies or "mixes-up" the order of the bits, bytes, words, or packets within the data stream according to a known algorithm.

Interleaving a Reed-Solomon-encoded data stream improves the efficiency of Reed-Solomon encoders/decoders by spreading burst errors across several or many Reed-Solomon codewords instead of being localized in one or a few codes. The output of symbol interleaver 130 is an FEC frame having a set number of bits, including the data and "redundant" bits if the Reed-Solomon codeword length does not divide evenly into the interleaver frame size. The size of the FEC frame and the specific algorithm used or the parameters used to implement the algorithm, may preferably be adjustable or programmable or may be determined by the parameters of Reed-Solomon encoder 120 or symbol interleaver 130, which also may be adjustable or programmable. The encoded and interleaved data can then be transmitted and de-interleaved and decoded at the data receiver with FEC decoder 160 having symbol de-interleaver 170 and Reed-Solomon decoder 180.

FEC system 100 is effective for providing data correction and recovery in the presence of brief data drop-outs across a transmission channel. However, FEC system 100 is only effective for providing data correction and recovery for extended data drop-outs in situations where there is a reference clock separate from the transmitted data stream. With the separate reference clock, the data recovery circuitry may easily detect the relative data position and the length of the data drop-out in order to facilitate the error correction and recovery. Although the typical FEC system 100 described herein uses Reed-Solomon coding techniques in combination with interleaving/de-interleaving techniques, other known FEC techniques may be used in accordance with the present invention.

Figure 2:
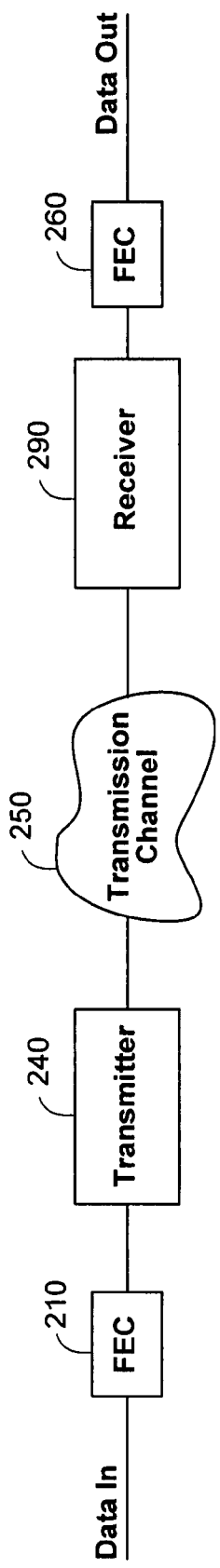
FIG. 2 is a simplified block diagram of an illustrative embodiment of a typical FEC system having an embedded clock signal.

FIG. 2 shows an illustration of typical FEC system 200 having an embedded clock signal. FEC system 200 contains FEC encoder 210, transmission channel 250, and FEC decoder 260 which all operate similarly or identically to their corresponding counterparts in FEC system 100. FEC system 200 also preferably include data transmitter 240 and data receiver 290. Data transmitter 240 and data receiver 290 preferably includes clock data recovery (CDR) transmitter and receiver circuitry, respectively, which allow a reference clock to be embedded in, and recovered from, a data stream. The embedded reference clock of the CDR data signal can be the same frequency as the reference clock frequency or any convenient fraction or multiple of the embedded clock frequency.

In particular, the reference clock signal frequency REFCLK is related to the embedded clock frequency EMBCLK by the following relationship:

$$REFCLK*W=EMBCLK,$$

where W is a convenient scale factor such as 0.5, 1, 2, 4, etc.

FEC system 200 may only be able to recover the data loss during limited data drop-outs. However, after an extended data drop out, the reference clock embedded within the data signal will be lost and thus the synchronization between data transmitter 240 and data receiver 290 will also be lost. Under these conditions the traditional FEC technique of FEC system 200 will not provide adequate data correction.

Figure 3:
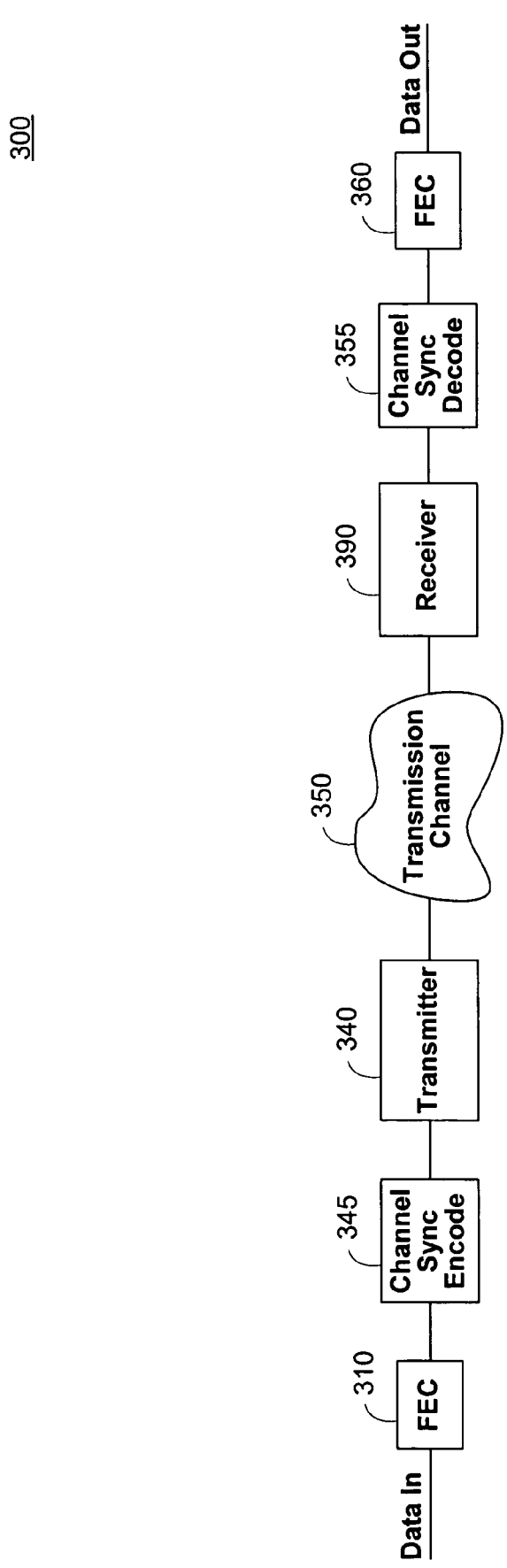
FIG. 3 is a simplified block diagram of an illustrative embodiment of an improved FEC system having an embedded clock signal in accordance with the invention.

FIG. 3 illustrates an improved FEC error correction system 300 which may be able to maintain data integrity for extended drop outs across high speed serial links. FEC system 300 includes FEC encoder 310, data transmitter 340, transmission channel 350, data receiver 390, and FEC decoder 360 which all operate similarly or identically to their corresponding counterparts in FEC system 200. FEC system 300 also preferably includes channel SYNC encoder 345 and channel SYNC decoder 355.

Figure 4:
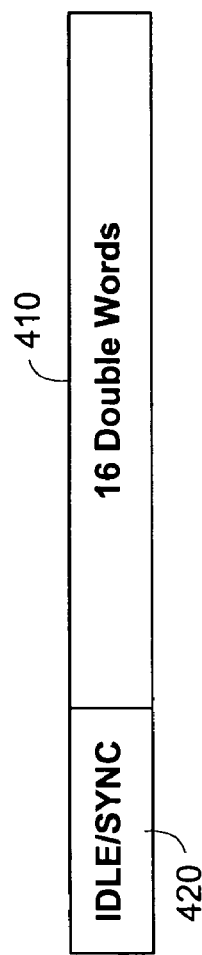
FIG. 4 is a simplified diagram of an illustrative data packet in accordance with the invention.
Figure 5:
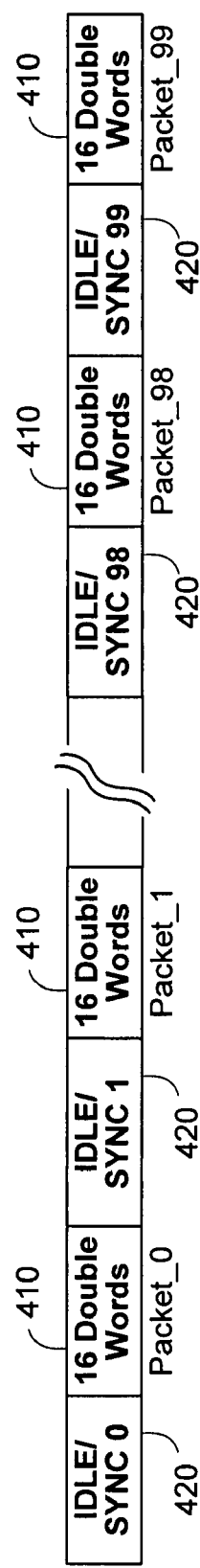
FIG. 5 is a simplified diagram of an illustrative FEC data frame in accordance with the invention.

Channel SYNC encoder 345 breaks each FEC data frame into sub-packets and inserts an IDLE/SYNC packet before each FEC frame sub-packet. FIG. 4 shows illustrative FEC data packet 400 having data sub-packet 410 which may be, for example, 16 double words in length along with an IDLE/SYNC packet 420 which may be, for example, one double word in length. In this example, each IDLE/SYNC packet is made up of two 8 bit data words. The first word of the IDLE/SYNC character is used to provide the IDLE character and the other word is used for the SYNC character. The length of the packets of the FEC frame sub-packets and the IDLE/SYNC packets used in the present example are merely illustrative. The size of these packets and the contents and make-up of the IDLE/SYNC packets may be adjustable or programmable. FIG. 5 shows illustrative FEC frame 500 output from channel SYNC encoder 345 according to the previous example. Frame 500 is made up of 100 data sub-packets 410 and 100 IDLE/SYNC packets 420.

The IDLE character of IDLE/SYNC packets may be used to keep data receiver 360 aligned in the boundaries of the FEC data frame sub-packets 410. The following example illustrates one technique by which the IDLE/SYNC packet may be used to maintain data alignment. Channel SYNC decoder 355 may contain two control signals, IDLE detect and IDLE status (not shown). The IDLE detect signal indicates when each IDLE signal has been detected by channel SYNC decoder 355. The IDLE status signal indicates when an IDLE character has been found by channel SYNC decoder 355 in an unexpected or incorrect location in the received data stream. Using these signals and a counter (also not shown), it is possible to determine that data has lost synchronization with the clock signal or that data have been lost or misaligned. Assuming the system is sending error free packets as shown in FIG. 4, the IDLE detect signal will be asserted every 17 double words received. If the IDLE detect signal is not asserted, one or more bits or bytes has been lost or a transmission error has occurred. Similarly, if the IDLE status signal is asserted, this also may indicate that one or more bits or bytes has been lost or corrupted. If either of these things happen, the received data is not written to memory. The system will wait until the next valid IDLE character is received.

The SYNC character of the IDLE/SYNC packet is used to embed control information within the FEC data frame. The SYNC character contains a number or a character, such as a sub-packet identification (ID) number, that may indicate the proper position of the following data sub-packet within the FEC frame. This sub-packet ID number can be used to determine the relative or absolute position of each data sub-packet within the FEC data frame.

For example, in the event of a transmission error, the position of an FEC frame sub-packet received following a valid IDLE/SYNC packet may be determined based on the packet ID number contained within the IDLE/SYNC packet. The FEC technique may allow the sub-packets lost or corrupted due to transmission errors to be recovered by FEC decoder 360.

Figure 6:
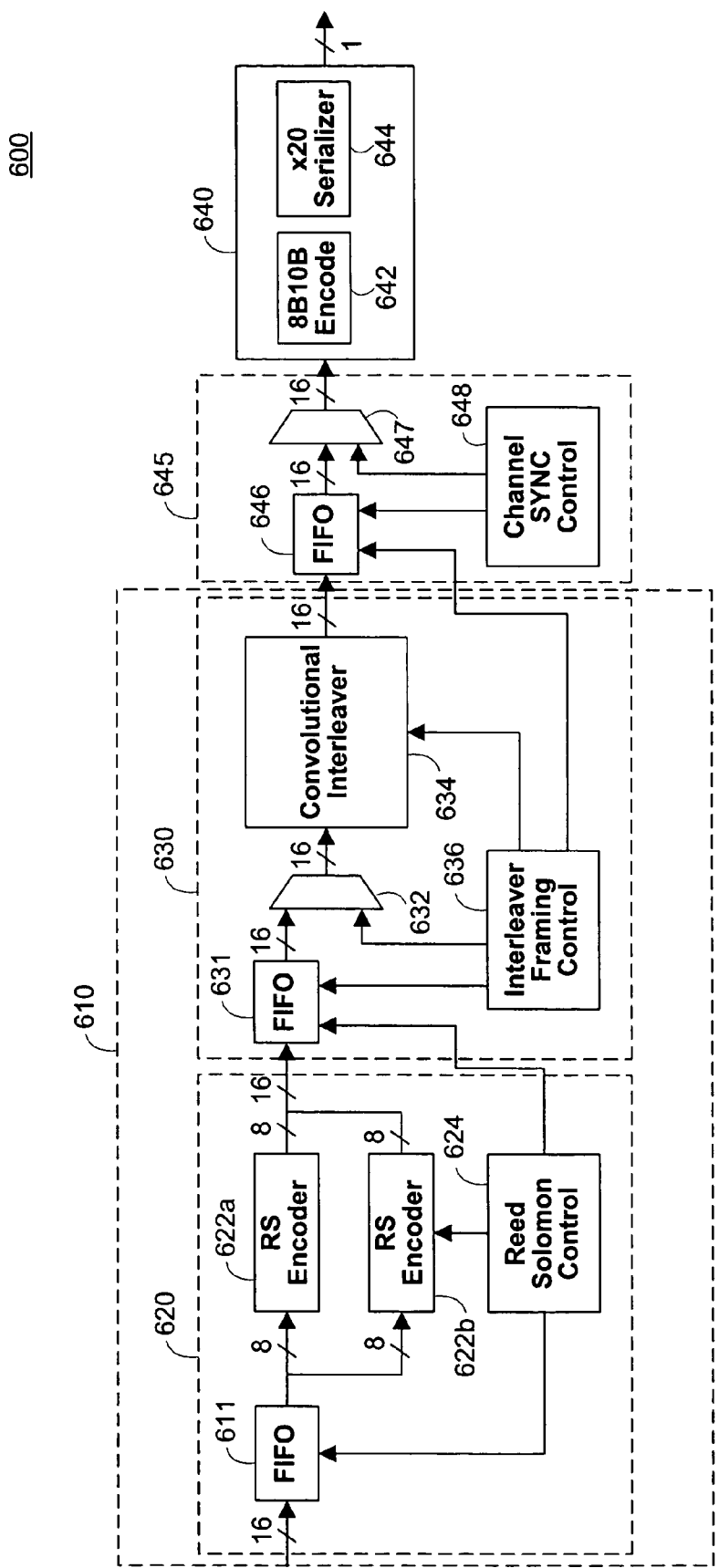
FIG. 6 is a simplified schematic block diagram of an illustrative embodiment of the transmission circuitry of an improved FEC system having an embedded clock signal in accordance with the invention.

FIG. 6 shows an illustrative schematic of the transmission circuitry of an improved FEC error correction system in accordance with the invention.

FEC error correction system 600 includes FEC encoder 610, data transmitter 640, and channel SYNC encoder 645 which all operate similarly or identically to their corresponding counterparts in FEC system 300. FEC encoding circuitry 610 includes Reed-Solomon encoder 620 and symbol interleaver 630, which both operate similarly or identically to their corresponding counterparts in FEC system 100.

In the present embodiment FEC system 600 receives an input which includes 16 parallel data inputs. This number of parallel data inputs is merely illustrative of a single embodiment of the present invention. According to another embodiment of the invention, any number of parallel data inputs or even a single data input may also be used. The data input to FEC system 600 is input to FEC encoding circuitry 610. At the input of FEC encoding circuitry 610 is first-in/first-out (FIFO) memory buffer 611. FIFO 611 receives the data input signals and outputs the data to Reed-Solomon encoder 620. FIFO 611 is used to properly control the flow of the data from the input of FEC encoder 610 to the input of Reed-Solomon encoder 620. FIFO 611 is used because the data input to FEC encoding circuitry 610 may be received at a different data rate than may be sent to the input of Reed-Solomon encoder 620. The data rates of the various elements of FEC system 600 are preferably adjustable or programmable or may be based on the preferably adjustable or programmable system specifications of FEC system 600.

The outputs of FIFO 611 are input to Reed-Solomon encoding circuitry 622, which is represented in the present embodiment by Reed-Solomon encoding circuitry 622*a* and Reed-Solomon encoding circuitry 622*b*. In this embodiment, two Reed-Solomon encoding circuits, each having 8 parallel inputs, are used to encode the 16 parallel data inputs. Any suitable number of conventional Reed-Solomon encoding circuits, having any suitable number of data inputs, may be used based on the design of the particular FEC encoding system. Each of the Reed-Solomon encoding circuits are controlled by Reed-Solomon controller 624 and output Reed-Solomon data packets. The outputs of Reed-Solomon encoder 620 are connected to the inputs of symbol interleaver 630.

Symbol interleaver 630 includes FIFO 631 to receive the outputs of Reed-Solomon encoder 620. Like FIFO 611, FIFO 631 can be used to support differences in the data rates between the output rate of Reed-Solomon encoder 620 and the input rate of symbol interleaver 630. Symbol interleaver 630 also includes multiplexer 632, interleaver 634, and interleaver framing control 636. Multiplexer 632 may be switched to alternatively pass the Reed-Solomon data packets interleaver framing control 636 packets to the input of interleaver 634. Interleaver framing control 636 may switch multiplexer 632 in order to insert additional header data and any necessary padding bits to form the FEC data frame at the outputs of symbol interleaver 634. The outputs of symbol interleaver 634 are connected to the inputs of channel SYNC encoder 645.

Channel SYNC encoder 645 includes FIFO 646 to receive the outputs of symbol interleaver 630. Like FIFO 611 and FIFO 631, FIFO 646 can be used to support different input and output data rates. Channel SYNC encoder 645 also includes multiplexer 647 and channel SYNC controller 648. As the FEC data packets are output from FIFO 646, channel SYNC controller 648 can switch multiplexer 647 to insert IDLE/SYNC packets into the FEC data packets at the appropriate intervals. The outputs of channel SYNC encoder 645 are connected to the inputs of data transmitter 640.

Data transmitter 640 may be any suitable or conventional data transmitter. According to the present embodiment of the invention, data transmitter additionally includes 8B10B encoder 642 and serializer 644. The outputs of channel SYNC encoder 645 are connected to data transmitter 640. Data transmitter 640 may use 8B10B encoder 642 to encode every 8-bits of a data stream into 10-bit codes that may result in a DC-balanced bit stream (e.g., the number of 0's and the number of 1's are equal), ease receiver synchronization, and may be able to insert and detect special control characters. Data transmitter 640 may also include any other type of suitable data encoder. Data transmitter 640 may also have serializer 644 which may convert the parallel inputs received by the transmitter into a single serial output.

Figure 7:
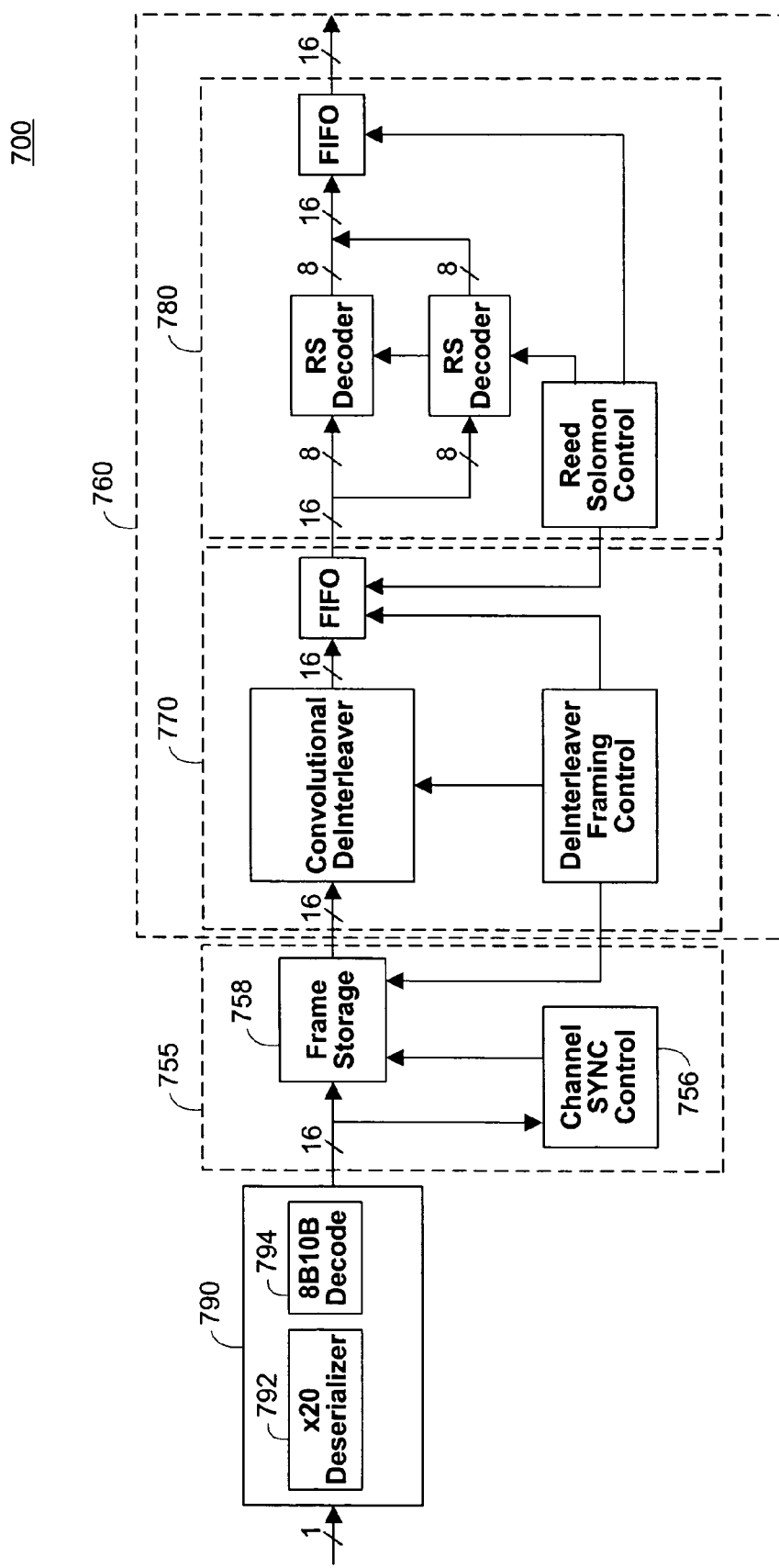
FIG. 7 is a simplified schematic block diagram of an illustrative embodiment of the receiver circuitry of an improved FEC system having an embedded clock signal in accordance with the invention.

FIG. 7 shows an illustrative schematic of the receiver circuitry 700 of an improved FEC error correction system in accordance with the invention.

FEC receiver circuitry 700 includes data receiver 790, channel SYNC decoder 755, and FEC decoder 760 which all operate similarly or identically to their corresponding counterparts in FEC system 300. FEC decoder 760 includes Reed-Solomon decoder 780 and symbol de-interleaver 770, which both operate similarly or identically to their corresponding counterparts in illustrative FEC system 100.

Data receiver 790 may be any suitable or conventional data receiver which is configured to receive the transmitted data signal from the data transmitter 640. According to the present embodiment data receiver 790 additionally includes 8B10B decoder 792 and de-serializer 794. The serial signal received at data receiver 790 is decoded and converted to multiple parallel signals, if necessary, and is output to channel SYNC decoder 755. Channel SYNC decoder 755 includes channel SYNC control 756 and frame storage memory 758. As the data signal or signals are output from the data receiver, channel SYNC control 756 detects the IDLE/SYNC packets. As previously described, during error-free transmission each FEC frame sub-packet is preceded by an IDLE/SYNC packet. When channel SYNC control 756 detects the IDLE/SYNC packets, channel SYNC control 756 writes the data of the following FEC frame sub-packet to the proper location of frame storage memory 758. Sub-packet identification (ID) number of the IDLE/SYNC packet can be used by channel SYNC control 756 to direct the received data to the proper memory location in frame storage memory 758. If an IDLE/SYNC packet is not received in the proper location in the data stream, the incoming data is not written to frame storage memory 758 until after the next valid IDLE/SYNC packet is received.

After the received data is written to frame storage memory 758, the data is decoded by FEC decoder 760 which includes Reed-Solomon decoder 780 and symbol de-interleaver 770, which operate in a similar manner as their encoding counterparts in FIG. 6.

Figure 8:
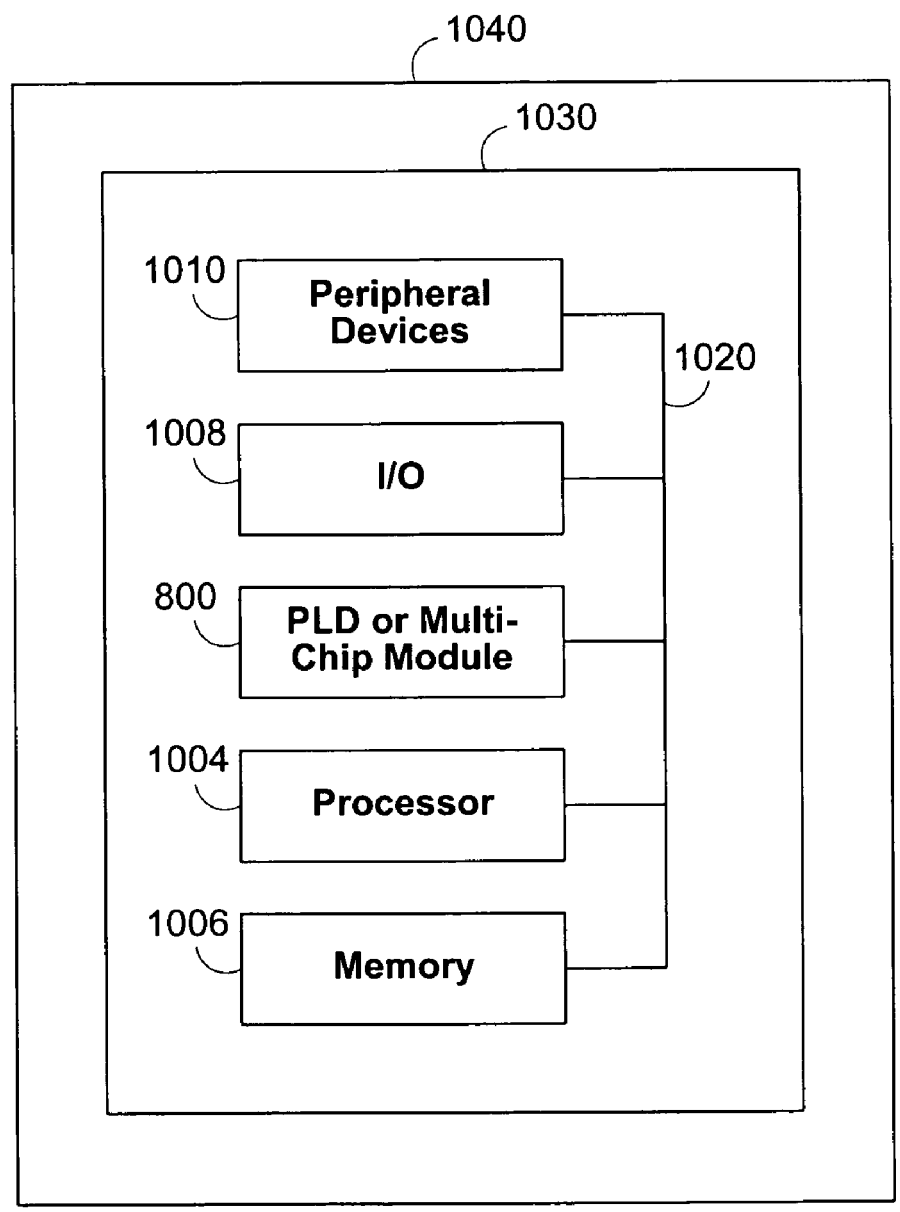
FIG. 8 is a simplified block diagram of an illustrative system employing circuitry in accordance with the invention.

FIG. 8 illustrates a PLD or multi-chip module 800 of this invention in a data processing system 1002. Data processing system 1002 may include one or more of the following components: a processor 1004; memory 1006; I/O circuitry 1008; and peripheral devices 1010. These components are coupled together by a system bus or other interconnections 1020 and are populated on a circuit board 1030 which is contained in an end-user system 1040. Any of the interconnections between element 800 and any other elements may be made using the above-described improved FEC signaling techniques.

System 1002 can be used in a wide variety of applications, such as computer networking, data networking, instrumentation, video processing, digital signal processing, or any other application where the advantage of using programmable or reprogrammable logic is desirable. PLD/module 800 can be used to perform a variety of different logic functions. For example, PLD/module 800 can be configured as a processor or controller that works in cooperation with processor 1004. PLD/module 800 may also be used as an arbiter for arbitrating access to a shared resource in system 1002. In yet another example, PLD/module 800 can be configured as an interface between processor 1004 and one of the other components in system 1002. It should be noted that system 1002 is only exemplary, and that the true scope and spirit of the invention should be indicated by the following claims.

Various technologies can be used to implement PLDs or multi-chip modules 800 having the features of this invention, as well as the various components of those devices (e.g., the above-described PLCs and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of this invention, and that various modifications can be made by those skilled in the art without departing from the scope and spirit of the invention. For example, the numbers of the various types of resources and components can be different from the numbers present in the depicted and described illustrative embodiments.

The invention claimed is:

1. Circuitry for maintaining data integrity across data links, said circuitry comprising:

an encoding circuit for dividing a data frame into a plurality of data sub-packets and inserting a plurality of sequential identification sub-packets in between said plurality of data sub-packets;

a transmitter circuit for transmitting said plurality of data sub-packets with said inserted plurality of sequential identification sub-packets by alternatively transmitting a sequential identification sub-packet and a data sub-packet;

a receiver circuit for receiving a sub-plurality of said transmitted data sub-packets and said sequential identification sub-packets; and a decoding circuit for:

identifying each of said received sequential identification sub-packets, obtaining data positions representing said received data sub-packets from said received sequential identification sub-packets, storing each of said received data sub-packets, wherein said received data sub-packets are stored in the sequence of said data frame in response to obtaining said data positions, and wherein the stored data includes place-holder positions representing the sub-plurality of data sub-packets not received by the receiver circuit, and recovering the sub-plurality of data sub-packets not received using the using the stored data sub-packets.

2. The circuitry of claim 1, wherein:

said encoding circuit comprises forward error correction encoding circuitry for encoding said data frame; and said decoding circuit comprises forward error correction decoding circuitry for recovering the sub-plurality of data sub-packets not received.

3. The circuitry of claim 1, wherein said dividing comprises dividing said data frame into a plurality of equally sized data sub-packets.

4. The circuitry of claim 1, wherein said decoding circuit further comprises a counter circuit for counting the amount of time between each of said identified plurality of sequential identification sub-packets.

5. The circuitry of claim 1, wherein said decoding circuit further comprises a counter circuit for counting the amount of data said decoding circuit receives between each of said identified plurality of sequential identification sub-packets.

6. Circuitry for maintaining data integrity across data links, said circuitry comprising:

an error correction encoding circuit for converting a data stream into at least one error correction encoded data frame;

a dividing circuit for dividing said at least one error correction encoded data frame into a plurality of data sub-packets and for inserting a plurality of identification sub-packets in between said plurality of data sub-packets, each of said identification sub-packets associated with one of said plurality of data sub-packets, and each said identification sub-packets storing information on the position of said associated data sub-packet within said error correction encoded data frame;

a transmitting circuit for transmitting said plurality of data sub-packets with said inserted plurality of sequential identification sub-packets by alternatively transmitting a sequential identification sub-packet and a data sub-packet;

a reconstructing circuit for detecting a sub-plurality of said plurality of identification sub-packets inserted between said plurality of data sub-packets and for reconstructing said at least one error correction encoded data frame, said reconstructing comprising obtaining said position information from said detected identification sub-packets, and inserting each of said detected data sub-packets into said reconstructed data frame according to said obtained position information, and wherein the reconstructed data frame includes place-holder positions for a sub-plurality of data sub-packets not detected by the receiver circuit; and an error correction decoding circuit for decoding said reconstructed data frame by recovering the sub-plurality of data sub-packets not detected using the data sub-packets stored in the reconstructed data frame.

7. The circuitry of claim 6, said error correction encoding circuit comprising Reed Solomon encoding circuitry.

8. The circuitry of claim 6, said error correction encoding circuit comprising data interleaving circuitry.

9. The circuitry of claim 6, further comprising a clock data recovery circuit for deriving a reference clock signal from said data stream.

10. The circuitry of claim 6, wherein said dividing circuit divides said at least one error correction encoded data frame into a plurality of data sub-packets of a pre-determined size.

11. Circuitry for maintaining data integrity across data links, said circuitry comprising:

an error correction encoding circuit for converting a data stream into at least one error correction encoded data frame;

a dividing circuit for dividing said at least one error correction encoded data frame into a plurality of data sub-packets and for inserting a plurality of identification sub-packets in between said plurality of data sub-packets, each of said identification sub-packets associated with one of said plurality of data sub-packets, and each said identification sub-packets storing information on the position of said associated data sub-packet within said error correction encoded data frame; and a transmitter circuit for transmitting said plurality of data sub-packets and said plurality of associated identification sub-packets by alternatively transmitting a sequential identification sub-packet and a data sub-packet across a data link, wherein a decoder circuit receiving a sub-plurality of the data sub-packets and their associated identification sub-packets wherein the decoder circuit can:

obtain said data position information from said received identification sub-packets, reconstruct a data frame from the sub-plurality of received data sub-packets and the obtained data positions, and recover the sub-plurality of data packets not received using the data sub-packets and the obtained data positions stored in the reconstructed data frame.

12. The circuitry of claim 11, wherein said transmitter circuit further comprises a serializer circuit for serially transmitting said plurality of data sub-packets and said plurality of associated identification sub-packets across said data link.

13. The circuitry of claim 11, wherein said transmitter circuit further comprises a circuit for encoding a reference clock signal within said divided error correction encoded data frame.

14. Circuitry for maintaining data integrity across data links, said circuitry comprising:

a transmitter circuit for transmitting said plurality of data sub-packets with said inserted plurality of sequential identification sub-packets by alternatively transmitting a sequential identification sub-packet and a data sub-packet;

a receiver circuit operable to receive at least one data frame divided into a plurality of data sub-packets and further comprising a plurality of identification sub-packets, each of said plurality of identification sub-packets associated with one of said plurality of data sub-packets and storing information on the position of said associated data sub-packet within said data frame, said receiver circuitry comprising:

a reconstructing circuit for detecting a sub-plurality of said identification sub-packets inserted between said plurality of data sub-packets and for reconstructing at least one data frame, said reconstructing comprising:

obtaining said position information from each of said detected sub-plurality of identification sub-packets, and inserting each of said detected data sub-packets into said reconstructed data frame according to said obtained position information, and wherein the reconstructed data frame includes place-holder positions for a sub-plurality of data sub-packets not detected by the receiver circuit; and an error correction decoding circuit for decoding said reconstructed data frame by recovering the sub-plurality of data sub-packets not detected using the data sub-packets stored in the reconstructed data frame.

15. The circuitry of claim 14, wherein said receiver circuit further comprises a de-serializer circuit for serially receiving said divided data frame across said data link.

16. The circuitry of claim 14, wherein said receiver circuit further comprises a circuit for receiving a reference clock signal encoded within said divided data frame.

17. A method for maintaining data integrity across data links, said method comprising:
 dividing a data frame into a plurality of data sub-packets;
 inserting a plurality of sequential identification sub-packets in between said plurality of data sub-packets;
 transmitting said data sub-packets with said inserted plurality of sequential identification sub-packets by alternatively transmitting a sequential identification sub-packet and a data sub-packet;
 receiving a sub-plurality of said transmitted sub-packets;
 identifying each of said received sequential identification sub-packets inserted between said received data sub-packets;
 obtaining position information from each of said received sequential identification sub-packets;
 storing each of said received data sub-packets following each of said sequential identification sub-packets, wherein said received data sub-packets are stored in the sequence of said data frame in response to obtaining said position information, and wherein the stored data includes data place-holder positions for a sub-plurality of data sub-packets not received; and
 recovering the sub-plurality of data sub-packets not received using the stored data sub-packets.

18. The method of claim 17, further comprising:
 encoding said data frame with a forward error correction algorithm; and
 recovering the sub-plurality of data sub-packets not received with said forward error correction algorithm.

19. The method of claim 17, wherein said dividing comprises dividing said data frame into a plurality of equally sized data sub-packets.

20. The method of claim 17, said method further comprising counting the amount of time between identifying each of said plurality of sequential identification sub-packets.

21. The method of claim 17,
 said method further comprising counting the amount of data received between identifying each of said plurality of sequential identification sub-packets.

22. A method for maintaining data integrity across data links, said method comprising:
 encoding data according to an error correction encoding algorithm into at least one error correction encoded data frame;
 dividing said at least one error correction encoded data frame into a plurality of data sub-packets;
 inserting a plurality of identification sub-packets in between said plurality of data sub-packets, each of said plurality of identification sub-packets associated with one of said plurality of said data sub-packets, and each of said plurality of identification sub-packets storing information on the position of said associated data sub-packets within said error correction encoded data frame;
 transmitting said plurality of data sub-packets and said plurality of inserted identification sub-packets by alternatively transmitting a sequential identification sub-packet and a data sub-packet;
 receiving a sub-plurality of said data sub-packets and said plurality of inserted identification sub-packets;
 detecting each of said received identification sub-packets;
 obtaining said position information from each of said received identification sub-packets;
 storing as at least one reconstructed data frame, each of said plurality of received data sub-packets associated with each of said detected identification sub-packets according to said obtained position information, and wherein the reconstructed data frame includes place-holder positions for a sub-plurality of data sub-packets not detected; and
 decoding said stored data according to a forward error correction decoding algorithm by recovering the sub-plurality of data sub-packets not detected using the data sub-packets stored in the reconstructed data frame.

23. The method of claim 22, wherein said encoding comprises Reed Solomon encoding.

24. The method of claim 22, wherein said encoding comprises data interleaving.

25. The method of claim 22, further comprising deriving a reference clock signal from said data stream.

26. The method of claim 22, wherein said dividing comprises dividing said at least one error correction encoded data frame into a plurality of data sub-packets of a pre-determined size.

27. A method for maintaining data integrity across data links, said method comprising:
 encoding a data stream into at least one encoded data frame;
 dividing said at least one encoded data frame into a plurality of data sub-packets;
 inserting a plurality of identification sub-packets in between said plurality of data sub-packets, each of said plurality of identification sub-packets associated with one of said plurality of data sub-packets, and each of said plurality of identification sub-packets storing information on the position of said associated data sub-packets within said encoded data frame; and
 transmitting said plurality of data sub-packets and said plurality of inserted identification sub-packets by alternatively transmitting a sequential identification sub-packet and a data sub-packet,
 wherein a sub-plurality of the data sub-packets and their associated position information are received and are used to recover the sub-plurality of data packets that are not received.

28. The method of claim 27, wherein said transmitting further comprises serially transmitting said divided encoded data frame across a data link.

29. The method of claim 27, wherein said transmitting further comprises encoding a reference clock signal within said divided encoded data frame.

30. A method for maintaining data integrity across data links, said method comprising:
 transmitting said plurality of data sub-packets and said plurality of inserted identification sub-packets by alternatively transmitting a sequential identification sub-packet and a data sub-packet;
 receiving at least one encoded data frame divided into a plurality of data sub-packets and further comprising a plurality of identification sub-packets, each of said plurality of identification sub-packets associated with one of said plurality of data sub-packets and storing information on the location of said data sub-packet within said encoded data frame, wherein said receiving comprises:

detecting a sub-plurality of said identification sub-packets inserted between said plurality of data sub-packets;

obtaining said location information from each of said detected sub-plurality of identification sub-packets;

reconstructing at least one error correction encoded data frame, said reconstructing comprising inserting each of said detected data sub-packets in said reconstructed data frame according to said obtained location information, and wherein the reconstructed data frame includes place-holder positions for a sub-plurality of data sub-packets that were not detected; and decoding said reconstructed data frame by recovering the sub-plurality of data sub-packets not detected using the data sub-packets stored in the reconstructed data frame.

31. The method of claim 30, wherein said receiving further comprises de-serializing said received divided encoded data frame.

32. The method of claim 30, wherein said receiving further comprises receiving a reference clock signal encoded within said divided encoded data frame.

* * * * *